United States Patent
Taylor et al.

(10) Patent No.: US 9,157,968 B1
(45) Date of Patent: Oct. 13, 2015

(54) SYSTEM AND METHOD FOR CHARACTERIZING THE HEALTH OF A RECHARGEABLE BATTERY

(75) Inventors: Glen Taylor, Newark, DE (US); Donato Vincenti, Tucson, AZ (US); John Jackson, Tucson, AZ (US)

(73) Assignee: SECURAPLANE TECHNOLOGIES, INC., Simi Valley, CA (US)

( * ) Notice: Subject to any disclaimer, the term of this patent is extended or adjusted under 35 U.S.C. 154(b) by 727 days.

(21) Appl. No.: 13/402,659

(22) Filed: Feb. 22, 2012

Related U.S. Application Data

(60) Provisional application No. 61/445,301, filed on Feb. 22, 2011.

(51) Int. Cl.
*G01R 31/36* (2006.01)
*G01R 31/00* (2006.01)

(52) U.S. Cl.
CPC ........ *G01R 31/3662* (2013.01); *G01R 31/3679* (2013.01); *G01R 31/008* (2013.01); *G01R 31/3648* (2013.01)

(58) Field of Classification Search
CPC ............. G01R 1/3662; G01R 31/3648; G01R 31/008; G01R 31/3679
See application file for complete search history.

(56) References Cited

U.S. PATENT DOCUMENTS

| | | | | |
|---|---|---|---|---|
| 2003/0204328 | A1* | 10/2003 | Tinnemeyer | 702/30 |
| 2011/0045351 | A1* | 2/2011 | Peled et al. | 429/220 |
| 2012/0150464 | A1* | 6/2012 | Swanton | 702/63 |

* cited by examiner

*Primary Examiner* — Alexander Satanovsky
(74) *Attorney, Agent, or Firm* — Knobbe Martens Olson & Bear, LLP

(57) ABSTRACT

A method for characterizing the health of a rechargeable battery includes measuring initial condition parameters of a rechargeable battery prior to the battery being placed into service. A baseline normalization of the initial condition parameters is performed using a standardized relationship data set for a norm battery to generate baseline normalization coefficients to normalize the initial condition parameters to the norm battery. Run-time condition parameters of the battery are measured after the battery is in service as part of a continuous built in test system. The run-time condition parameters are normalized using the standardized relationship data set for the norm battery and the baseline normalization coefficients to generate normalized run-time condition parameters for the battery. The normalized run-time condition parameters are then compared to the standardized relationship data set for the norm battery to calculate a state-of-charge and state-of-health for the battery as the run-time condition.

20 Claims, 10 Drawing Sheets

SYSTEM AND METHOD FOR CHARACTERIZING THE HEALTH OF A RECHARGEABLE BATTERY

CROSS-REFERENCE TO RELATED APPLICATIONS

The present application claims priority under 35 U.S.C. §119(e) to U.S. Provisional Patent Application Ser. No. 61/445,301, entitled "SYSTEM AND METHOD FOR CHARACTERIZING THE HEALTH OF A RECHARGEABLE LITHIUM BATTERY," filed Feb. 22, 2011, the entire disclosure of which is hereby expressly incorporated by references in its entirety and should be considered a part of this specification.

BACKGROUND

1. Field

The present invention is directed to rechargeable batteries, and more particularly to an improved system and method for characterizing the health of a rechargeable battery.

2. Description of the Related Art

Systems and methods for characterizing the health of batteries (e.g., rechargeable batteries) are used, for example, in aircraft systems to determine if a battery requires maintenance or provide an indication of end-of-life for the battery. Conventional systems and methods for characterizing the health of batteries rely on theoretical models or "feed forward" models. However, such conventional systems are less accurate and do not account for feedback based on the operational conditions of the battery, or variances between batteries.

Therefore, an improved system and method for characterizing the state-of-health and state-or-charge of a battery is needed that utilizes empirical data to calculate the health and charge of the battery and accounts for variances between batteries.

SUMMARY

In accordance with one embodiment, a system for characterizing the health of a rechargeable battery of an aircraft is provided. The system comprises a test module electrically connectable to a rechargeable battery, the test module configured to pass at least one current pulse across the battery, the test module further configured to measure one or more operational parameters of the battery. The system also comprises a computer readable medium configured to store a standardized relationship data set for a norm battery that defines one or more relationships between a plurality of battery parameters, and one or more baseline normalization coefficients defining the relationship between the battery and the norm battery for normalizing parameters of the battery to the norm battery. The system further comprises a computer processor configured to receive the one or more measured operational parameters of said battery from the test module and retrieve the standardized relationship data set and baseline normalization coefficients from the computer readable medium. The processor is configured to apply the standardized relationship data set and baseline normalization coefficients to the measured operational parameters to generate normalized operational parameter measurements. The processor is further configured to calculate the state-of-health and state-of-charge of the battery based at least in part on the normalized operational parameter measurements.

In accordance with another embodiment, a method for characterizing the health of a rechargeable battery of an aircraft is provided. The method comprises measuring one or more of parameters of a rechargeable battery prior to the battery being placed into service in an aircraft, the one or more measured parameters defining initial condition parameters of the battery. The method also comprises performing a baseline normalization of the one or more initial condition parameters of the battery using a standardized relationship data set for a norm battery to generate one or more baseline normalization coefficients to normalize the one or more initial condition parameters of the battery to the norm battery. The method further comprises placing the battery in operation in an aircraft and measuring one or more parameters of a battery after the battery has been placed into service, said one or more parameters defining one or more run-time condition parameters of the battery. The method also comprises performing a normalization of the one or more run-time condition parameters using the standardized relationship data set for the norm battery and the baseline normalization coefficients to generate one or more normalized run-time condition parameters for the battery. The method further comprises comparing the one or more normalized run-time condition parameters to the standardized relationship data set for the norm battery, and calculating one or both of a state-of-charge and state-of-health for the battery at said run-time condition.

In accordance with another embodiment, a method for characterizing the health of a rechargeable battery of an aircraft is provided. The method comprises measuring one or more parameters of a battery after the battery has been placed into service, said one or more parameters defining one or more run-time condition parameters of the battery. The method also comprises retrieving a standardized relationship data set for a norm battery and one or more baseline normalization coefficients from a computer readable medium, where the one or more baseline normalization coefficients are generated from a baseline normalization of one or more initial condition parameters of the battery using the standardized relationship data set for a norm battery to eliminate battery-to-battery variances. The method further comprises performing a normalization of the one or more run-time condition parameters using the standardized relationship data set for the norm battery and the baseline normalization coefficients to generate one or more normalized run-time condition parameters for the battery. Additionally, the method comprises comparing the one or more normalized run-time condition parameters to the standardized relationship data set for the norm battery, and calculating one or both of a state-of-charge and state-of-health for the battery at said run-time condition.

DETAILED DESCRIPTION

Nameplate Capacity, as used herein, defines the nominal capacity of the battery, for example, at 1 C discharge rate at 23° C.

State-of-health (SOH), as used herein, means the relative "health" or degree to which the nameplate capacity can be utilized. For example, a battery that can output 100% of its nameplate Amp-hours (Ah) when fully charged has a 100% SOH, and a battery that can only output 80% of its nameplate Ah when fully charged has 80% SOH. Ideally, ignoring variables such as temperature and manufacturing variances, there is a defined relationship between measured impedance and SOH, so that for a given measured impedance, the SOH can be calculated. However, the algorithm disclosed herein calculates SOH in non-ideal cases where variables such as temperature and manufacturing variances affect impedance measurements and therefore the SOH calculation.

State-of-charge (SOC), as used herein, means the percentage to which the battery is charged, regardless of its SOH (or usable capacity). For example, a battery that can only output a portion of its nameplate Ah (e.g., that has less than 100% SOH) can still take a full charge. Ideally, ignoring variables such as temperature and manufacturing variances, there is a defined relationship between measured voltage and SOC, so that for a given measured voltage, the SOC can be calculated. However, the algorithm disclosed herein calculates SOC in non-ideal cases where variables such as temperature and manufacturing variances affect voltage measurements and therefore the SOC calculation.

True Capacity is a combination of the SOC and SOH, among other parameters (e.g., temperature). Under standardized temperature conditions, True Capacity is defined by the equation True Capacity=SOC (%)*SOH (%). Under varying temperature conditions, True Capacity is defined by the equation True Capacity=SOC (%)*SOH (%)*Ktemp, where Ktemp is the temperature compensation factor.

Figure 1:
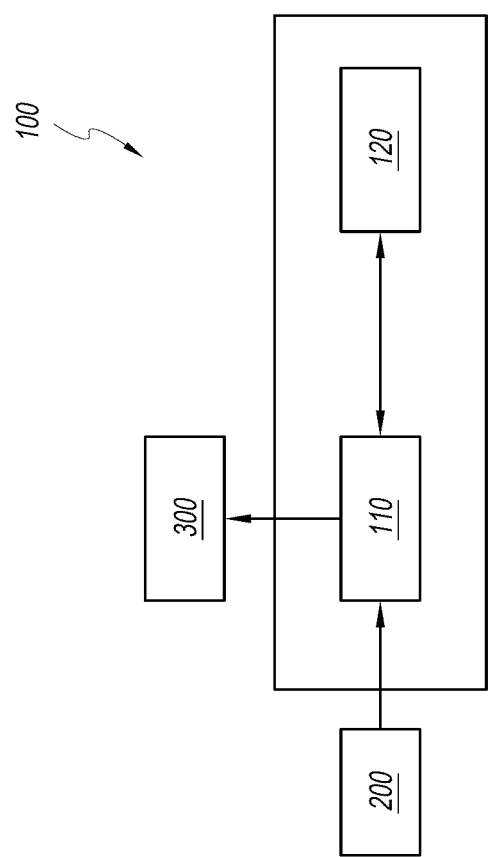
FIG. 1 is a schematic block diagram of a control system for characterizing the health of a rechargeable battery

FIG. 1 shows on embodiment of a control system 100 for use in calculating the health of a rechargeable battery. The control system 100 can include a processor 110 that can communicate with a computer readable medium or memory 120. The processor 110 can receive information from a test module 200, such as measurement information discussed further below. The processor 110 can also communicate with the memory 120 to retrieve information from the memory 120 as well as to communicate information to the memory 120 for storage, as discussed further below. The processor 110 can execute instructions, such as the process or algorithm 2000 of FIG. 4 and the routines of FIGS. 7 and 8, and can communicate (e.g., in a wired or wireless manner, such as with radio frequency (RF)) one or more output signals to an external interface 300 (e.g., external battery interface or user interface) to report the health of the rechargeable battery, as further discussed below.

Figure 4:
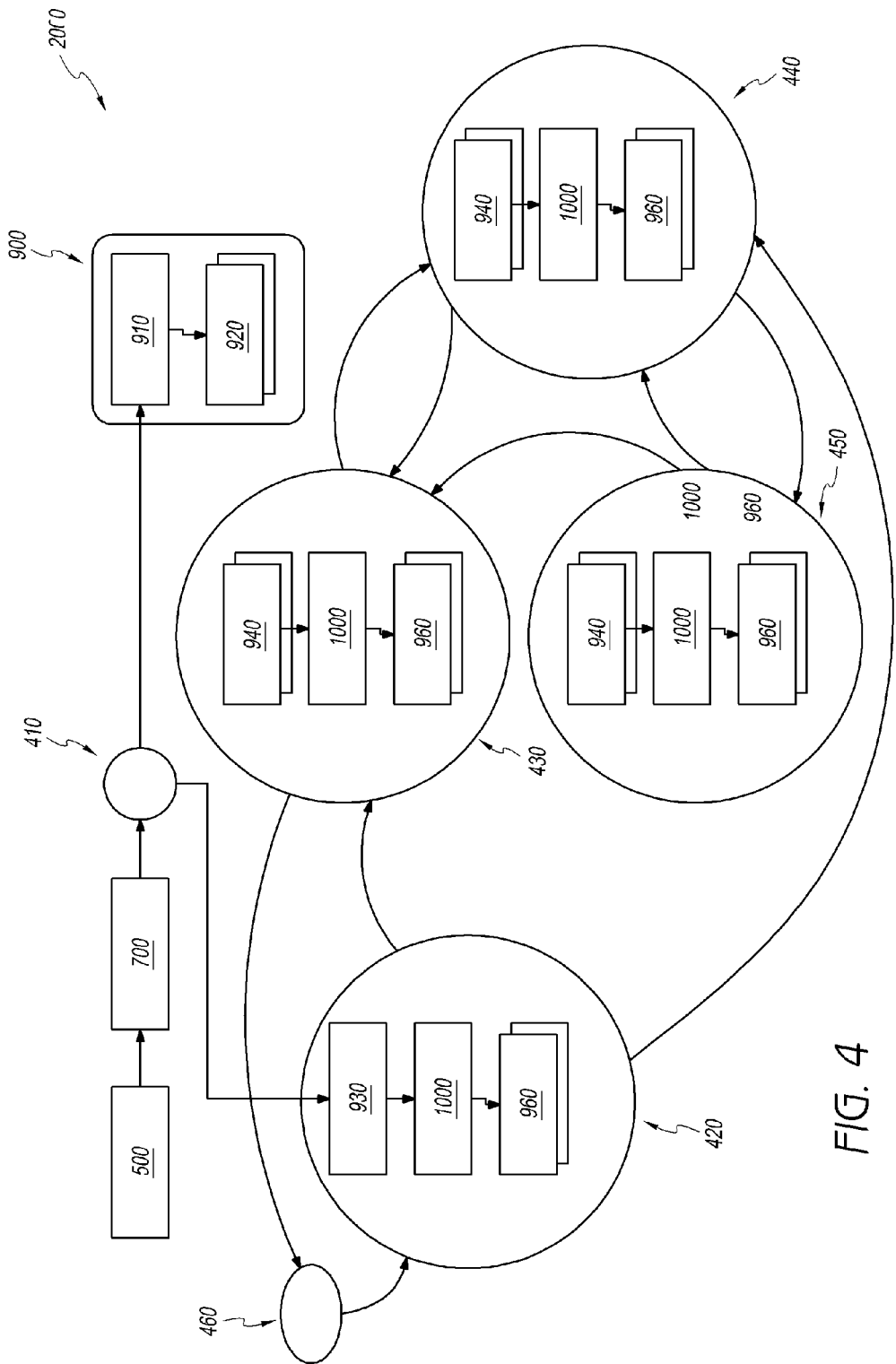
FIG. 4 is a schematic flow chart for one embodiment of an algorithm for characterizing the health of the rechargeable battery.
Figure 5:
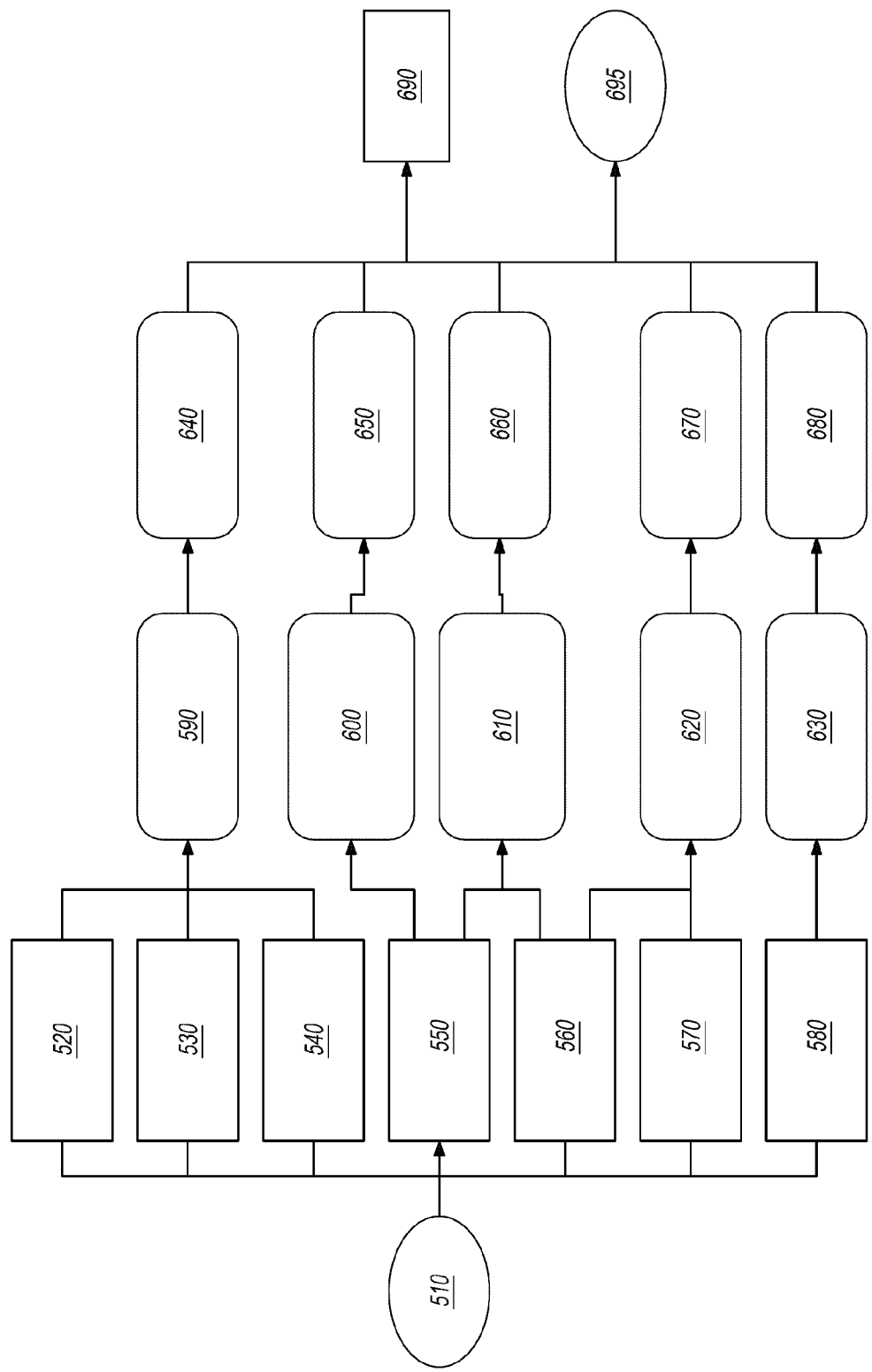
FIG. 5 is a schematic flow chart for generating a standardized relationship data set for use in the algorithm of FIG. 4.
Figure 6A:
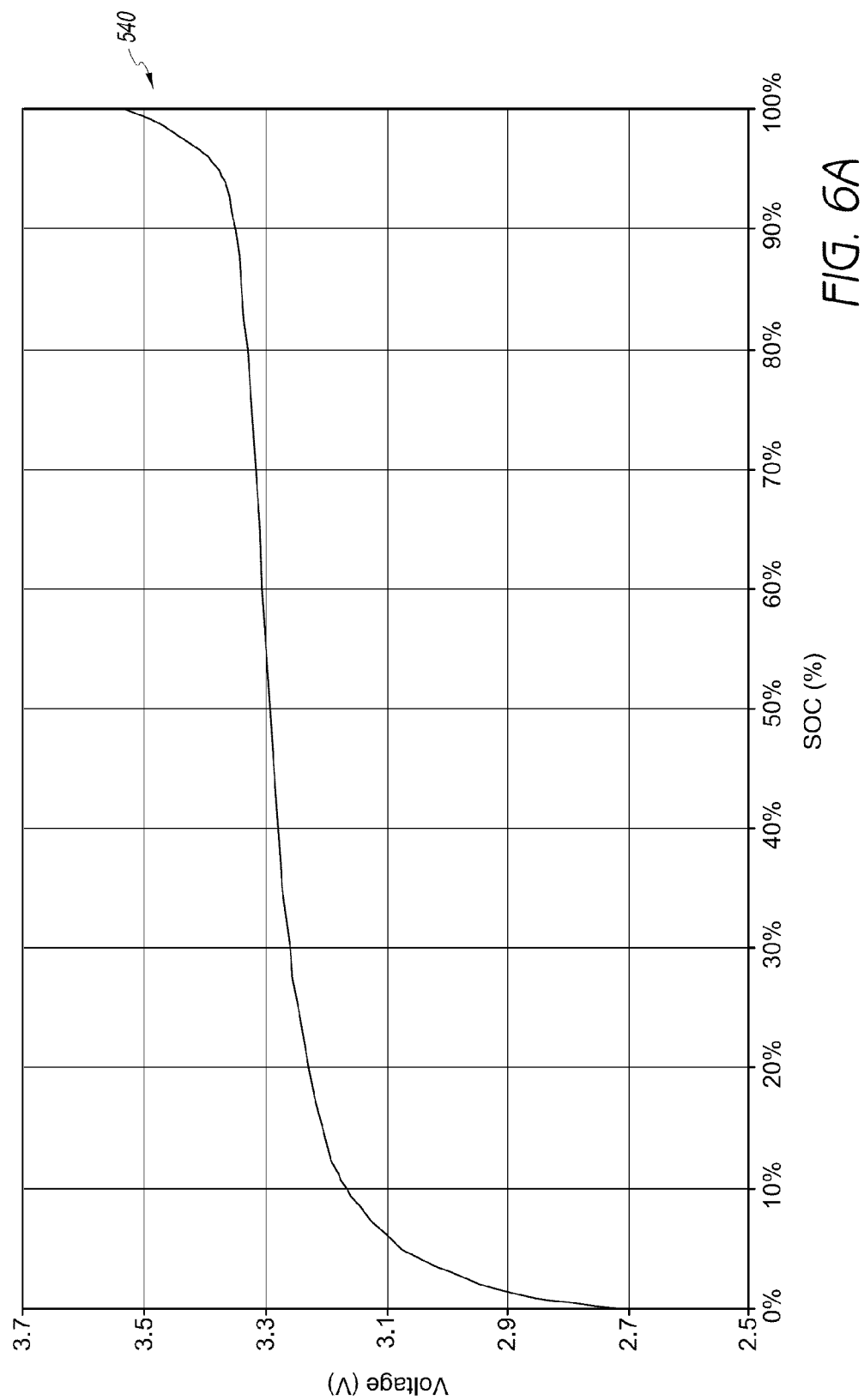
FIG. 6A is a graph of one parameter relationship based on the standardized relationship data set of FIG. 5.
Figure 6B:
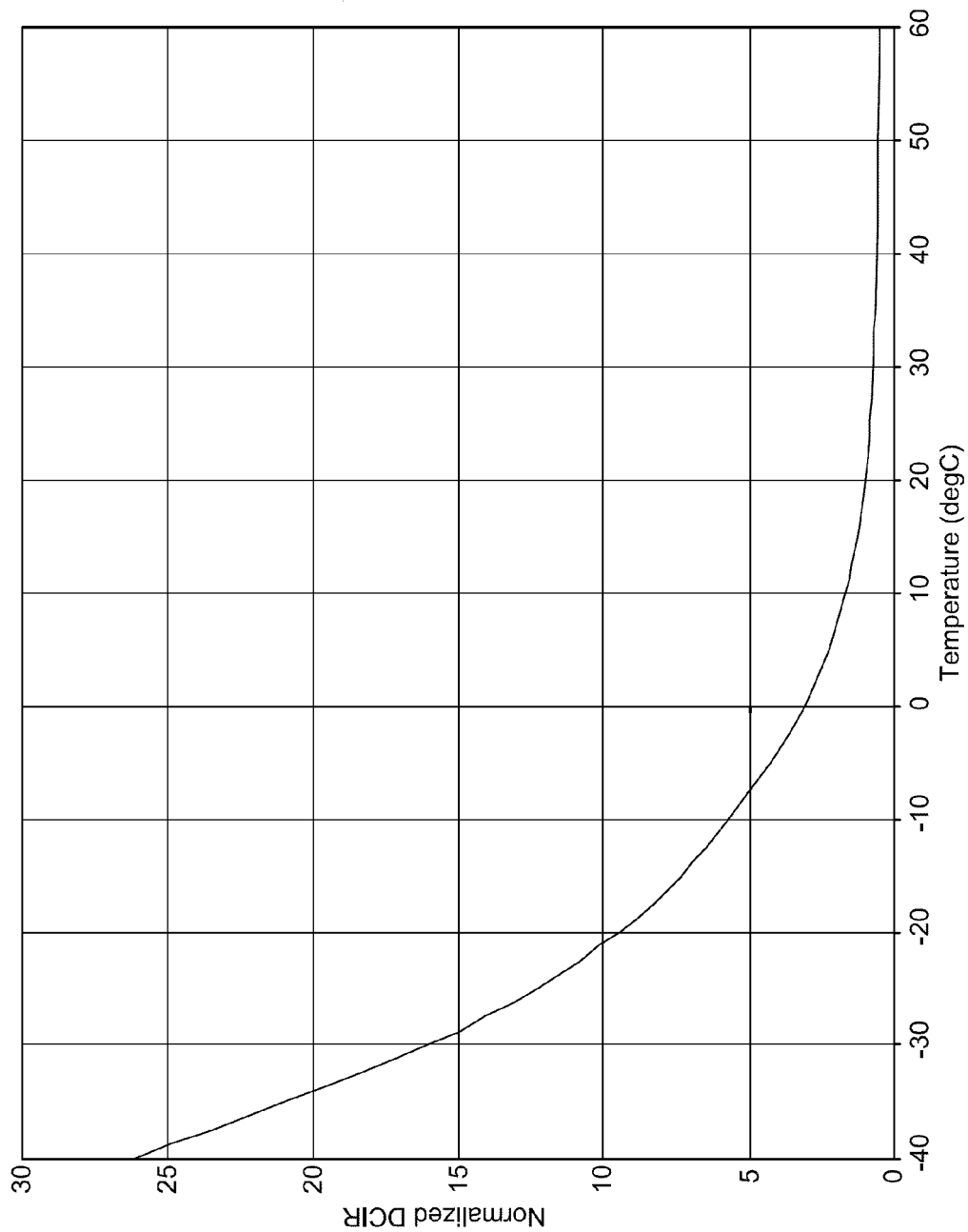
FIG. 6B is a graph of another parameter relationship based on the standardized relationship data set of FIG. 5.
Figure 6C:
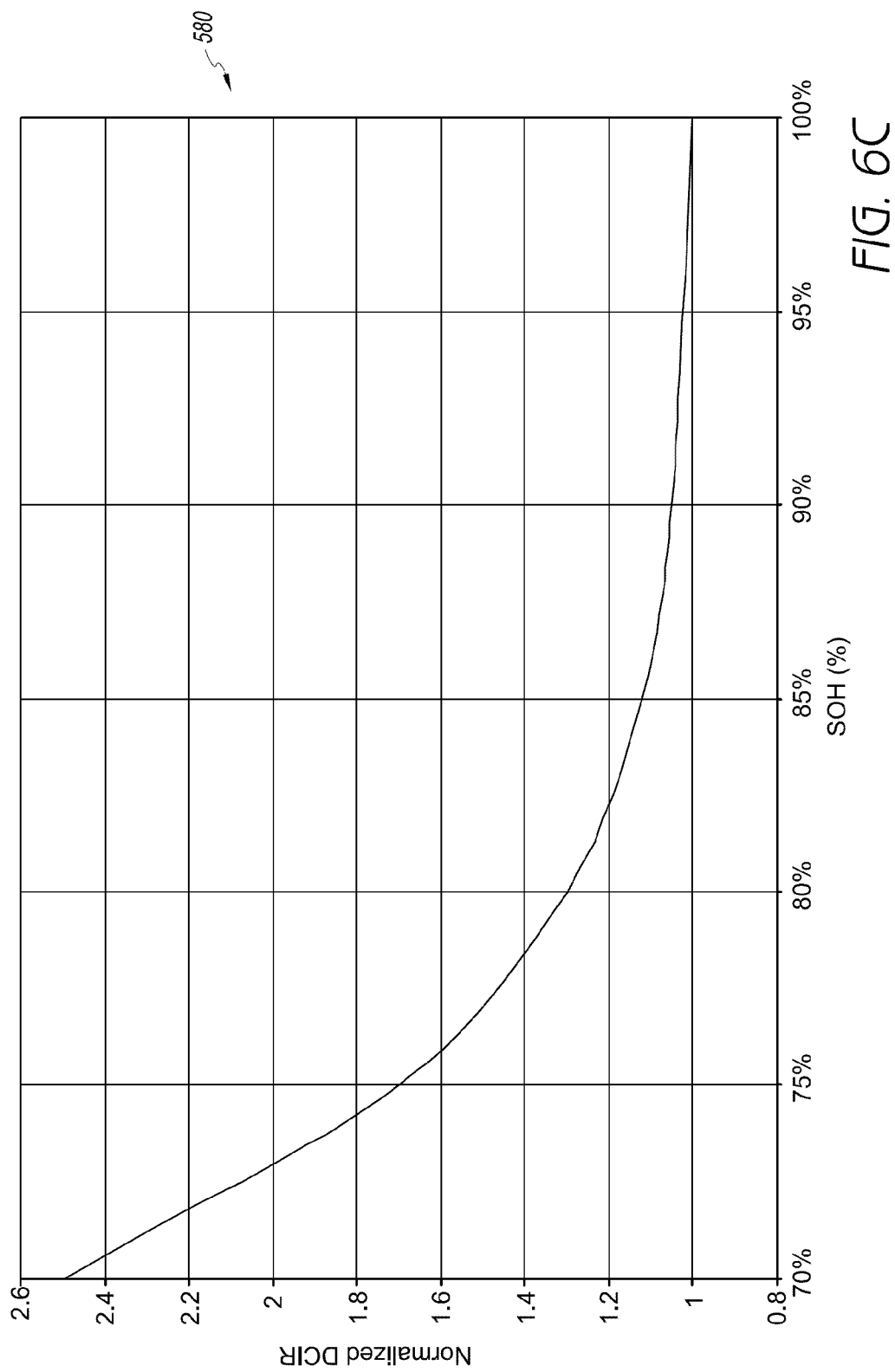
FIG. 6C is a graph of another parameter relationship based on the standardized relationship data set of FIG. 5.
Figure 7:
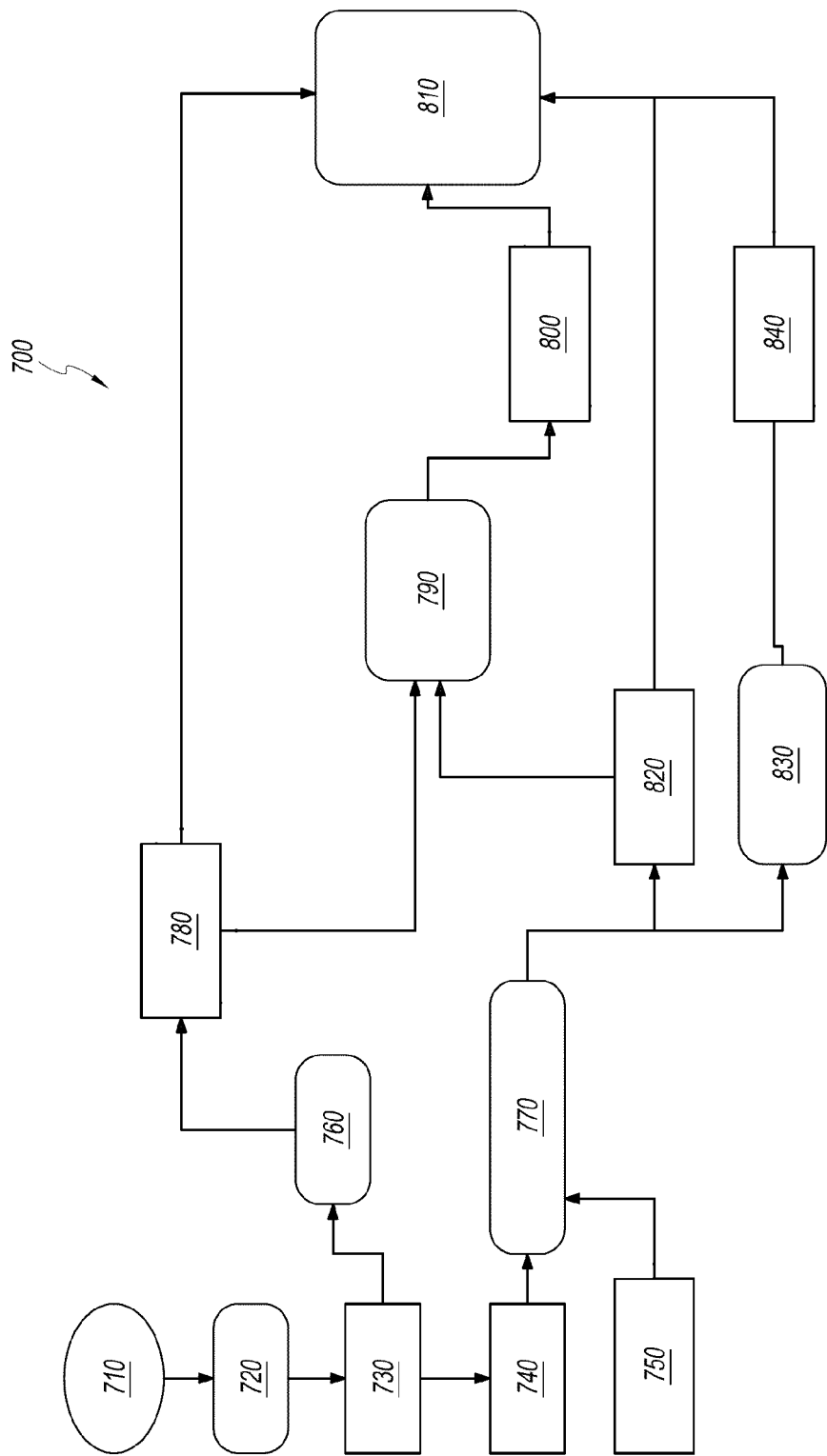
FIG. 7 is a schematic flow chart of a baseline normalization process used in the algorithm of FIG. 4.
Figure 8:
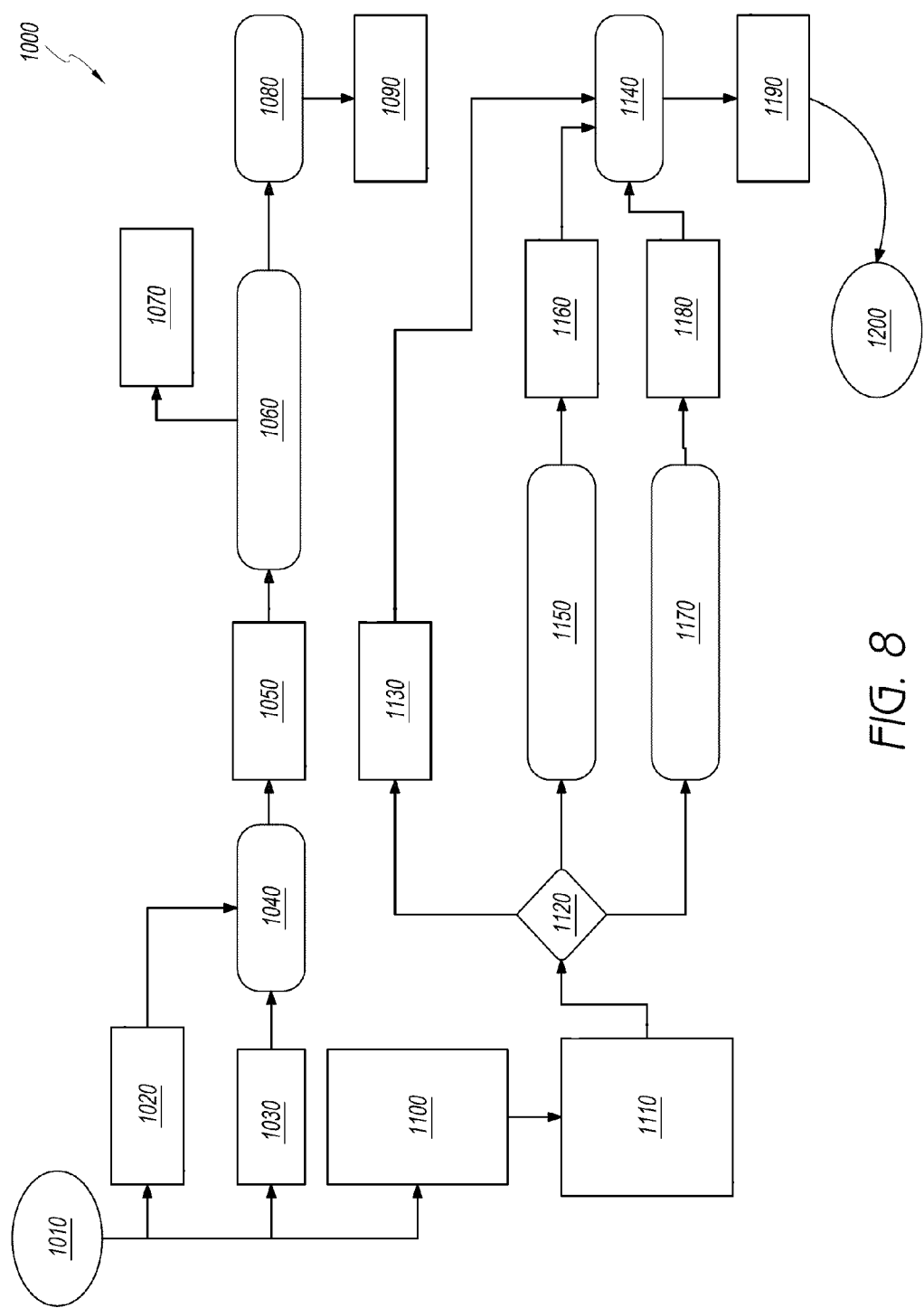
FIG. 8 is a schematic flow chart of a run-time normalization process used in the algorithm of FIG. 4.

In one embodiment, the memory 120 can be non-volatile memory for storing information and instructions to be executed by the processor 110, such as the process or algorithm 2000 of FIG. 4, the standardized relationship data of FIGS. 5-6C, and the routines of FIGS. 7 and 8. The memory 120 can also be used for storing temporary variables or other intermediate information during execution of instructions to be executed by the processor 110. For example, the memory 120 can store one or more measured parameters of the battery. The memory 120 can further include a read only memory (ROM) or other static storage device for storing static information and instructions provided to the processor 110.

Figure 2:
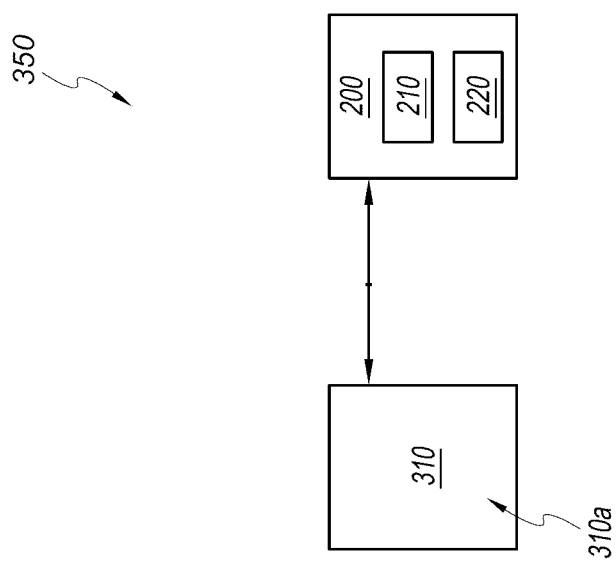
FIG. 2 is a schematic view of one embodiment of a test module removably attached to rechargeable battery.

FIG. 2 shows one embodiment of a test module 200 that can be removably electrically connected to a battery 310, such as a rechargeable lithium ion battery (e.g., lithium iron phosphate battery). In one embodiment, the test module 200 is internal to the battery system (e.g., battery pack 310). In another embodiment, the test module 200 is external to the battery system. The test module 200 can have a SOH low current pulse generator 210 (e.g., low current pulse FET CNTRL) and a SOH high current pulse generator 220 (e.g., high current pulse FET CNTRL) that form part of a SOH impedance test circuit. In one embodiment, the battery 310 can be a Lithium Iron Phosphate battery with 26650 form factor, 2.3 Ah and 3.2 V ratings. However, in other embodiments, the battery 310 can be other battery types with other operational ratings, such as an STI Lithium battery. The battery 310 can be a battery pack that includes one more modules with cells 310a (e.g., arranged in parallel or series). In the illustrated embodiment, the battery 310 is installed in an aircraft 350. However, the battery 310 can be installed in incorporated into other systems that require battery power. The test module 200 is operated while the battery 310 is disconnected from a bus of the system 350. Further details of the operation of the test module 200 are provided further below.

Figure 3:
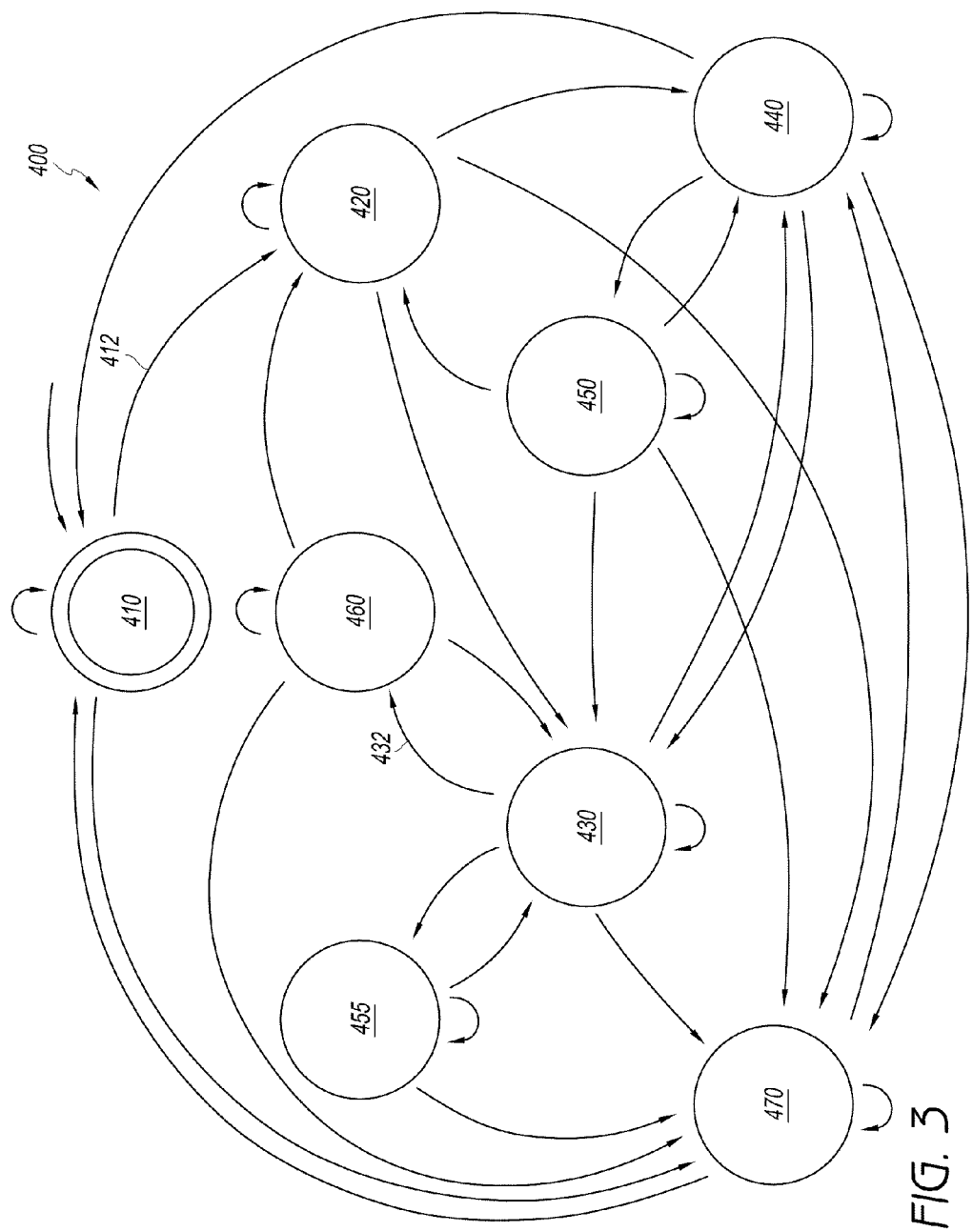
FIG. 3 is a schematic state diagram for a battery during operation.

As discussed above, the battery 310 can be installed in an airplane system 350. FIG. 3 shows one embodiment of a state diagram algorithm 400 for operation of the battery 310 of the aircraft 350, which shows the different modes of operation of the battery 310. The battery 310 can have a SHELF STATE 410 when the battery 310 is ready for storage at a warehouse or is fully powered down and removed from the aircraft 350 (i.e., system is shut-off). When the battery is installed in the aircraft 350, two straps 412 are added and the battery 310 transitions from the SHELF STATE 410 to a STANDBY TEST STATE 420. If only one of the straps 412 is present, a fault is reported to one or more of the aircraft 350, the control system 100 and the external interface 300 of the battery 310.

While in the STANDBY TEST STATE 420, a test timer runs and the control system 100 conducts a power-on built in test (PBIT) and impedance tests on the battery 310 using the test module 200, as discussed further below. If power is required by the aircraft 350 while in the STANDBY TEST STATE 420, the algorithm 400 aborts the impedance testing and transitions to a DISCHARGE STATE 430 to meet the load requirement of the aircraft 350. If no such power is required by the aircraft 350 while in the STANDBY TEST STATE 420, the PBIT and impedance test are completed by the test module 200 and the BATTERY 310 transitions to a STANDBY STATE 440, where it is determined by a battery state machine (e.g., hardware control system 100) whether the battery 310 needs to be charged or to discharge.

If it's determined that the battery 310 needs to charge (e.g., if the battery pack voltage is less than about 26.5 volts), the algorithm 400 transitions operation of the battery 310 to a CHARGE STATE 450. If at any time during charging, power is required by the aircraft 350, the algorithm 400 transitions operation of the battery 310 to the DISCHARGE STATE 430. Otherwise, once the battery 310 is charged, the algorithm 400 transitions the battery 310 to the STANDBY TEST STATE 420, where the impedance testing is again performed by the testing module 200, or back to the STANDBY STATE 440 depending of the level of the terminal voltage. If while in the STANDBY STATE 440 it is instead determined that the battery needs to discharge (e.g., because of power demand from the aircraft 350), the algorithm 400 transitions from STANDBY STATE 440 to DISCHARGE STATE 430. While in the DISCHARGE STATE 430, if the battery 310 current drops below a certain amount (e.g., 250 mA, battery 310 operation can transition back to the STANDBY STATE 440, for example after a delay.

If while in the DISCHARGE STATE 430 it is determined by the battery control system 100 that the maximum delta voltage between cells 310a of the battery 310 is greater than a predetermined amount, the algorithm 400 transitions to a DISCHARGE BALANCE STATE 455 where power sharing is implemented between the cells 310a of the battery 310 so that the battery cells 310a discharge at substantially the same time so all the energy in the battery 310 can be used. In one embodiment, the predetermined amount can be about 100 mV. However, in other embodiments, the predetermined amount can be lower or higher than 100 mV. Such power sharing can occur where the health of the battery 310 is such that one cell 310a discharges faster than another cell 310a. Once the maximum delta voltage is less than a second predetermined amount, the algorithm 400 transitions back to the DISCHARGE STATE 430. In one embodiment, the second predetermined amount can be about 25 mV. However, in other embodiments, the second predetermined amount can be lower or greater than 25 mV.

If while in the DISCHARGE STATE 430, there is no power load (e.g., from the aircraft 350), a sleep timer 432 is initiated. If the battery 310 detects a load current while the timer 432 is running, the timer 432 is reset. Otherwise, after the expiration of the sleep timer 432, the algorithm 400 transitions the battery 310 to a SLEEP STATE 460 to inhibit draining of the battery 310. In the SLEEP STATE 460, non-critical power supplies and circuits are shut down, thereby conserving battery 310 power. This occurs, for example, when the aircraft 350 is brought into a hanger and input power is turned off to non-critical components. In one embodiment, the sleep timer 432 expires after about 9.5 hours after no detection of a power load. However, in other embodiments, the sleep timer 432 can expire after lower or greater time periods.

From the SLEEP STATE 460, the operation of the battery 310 can transition to the DISCHARGE STATE if power is required by the aircraft 350, or to STANDBY TEST STATE 420 if the current of the battery 310 is less than a third predetermined amount following a time delay. In one embodiment, the third predetermined amount can be about 250 mA. In another embodiment, the third predetermined amount can be lower or higher than 250 mA. From any state, the algorithm 400 can transition to the FAULT STATE 470 if a fault is detected. Once the fault is reset, the algorithm 400 transitions battery 310 operation back to the STANDBY STATE 440.

With continued reference to FIG. 3, a mechanical contactor (MCTR) (not shown) that connects the battery 310 to a bus of the airplane system 350 is off or disconnected with the battery 310 is in the SHELF STATE 410, STANDBY TEST STATE 420, STANDBY STATE 440, CHARGE STATE 450, and FAULT STATE 470. The mechanical contactor is on or connected to the bus when the battery 310 is in the DISCHARGE STATE 430, DISCHARGE BALANCE STATE 455 or SLEEP STATE 460. The battery system also has a charger/balancer (not shown), which is on in the DISCHARGE BALANCE STATE 455 and the CHARGE. STATE 450, but off at other states of battery operation.

FIG. 4 shows one embodiment of an algorithm 2000 for characterizing the health of the rechargeable battery 310. The algorithm 2000 includes a norm data determination module or routine 500 (see also FIG. 5) for determining ideal or norm battery parameter relationships that run-time measurements and calculations are compared against for determination of the state-of-charge (SOC) and the state-of-health (SOH) of the battery 310. As used herein, the "ideal" case parameter relationships, refer to norm parameter relationships based on a sampling of a number of batteries (e.g., a "typical" 2.3 Ah battery cell when fully charged and measured at 25° C.) to provide a controlled "norm" against which subsequent battery parameter measurements are compared, not necessarily to an ideal battery. In one embodiment, the ideal or norm parameter relationships are determined from the average measurements of battery cells at a predetermined temperature (e.g., 25° C.). The norm data is collected or captured via testing and characterization of a number of representative battery cells by an external equipment and data collection method similar to the test module 200, which is internal to the battery system. In one embodiment, ten battery cells are tested to collect the norm data. However, in other embodiments, fewer or more battery cells are tested to collect the norm data. The algorithm 2000 provides for the normalization of measured parameters of the battery 310 to factor out variances and operational conditions of the battery 310 so that as set of measurements can be used and compared against the norm or ideal battery case of open circuit voltage (OCV) vs. state-of-charge (SOC) and change in impedance (Krdc_soh) vs. state-of-health (SOH). That is, normalization allows for non-ideal battery measurements to be re-calculated or "normalized" to the norm or ideal case so that errors introduced by variables such as temperature and manufacturing variances can be factored out when calculating SOH and SOC.

With reference to FIG. 5, when the norm data determination routine 500 starts 510, the test module 200 can be connected to one battery cell (not shown), and a variety data of the battery cell is collected. In one embodiment, the norm data determination 500 can collect the following data: charging curves 520 (e.g., battery cell charge vs. time), discharging curves 530, open cell voltage (OCV) versus state-of-charge (SOC) curves 540, battery resistance or internal DC impedance (Rdc) versus temperature (T) curves 550, battery resistance (Rdc) versus state-of-charge (SOC) curves 560, battery resistance (Rdc) versus impedance Z curves 570, and battery resistance (Rdc) versus state-of-health (SOH) curves 580. FIGS. 6A, 6B and 6C show sample curves for open cell voltage (OCV) versus state-of-charge (SOC) %, battery resistance (Rdc or DCIR) versus temperature, and battery resistance (Rdc or DCIR) versus state-of-health (SOH) %, respectively. In one embodiment, the norm data is collected at a controlled temperature. For example, in one embodiment, the norm data is collected at 25° C. However, in other embodiments, the norm data can be collected at another temperature.

With continued reference to FIG. 5, the data of the charging 520, discharging 530 and OCV-SOC 540 curves are combined and evaluated and an ideal OCV-SOC curve determined 590, after which the curve fit of the OCV-SOC curve is determined 640 to provide an equation for state-of-charge (SOC) as a function of OCV.

The data of the battery resistance (Rdc) versus temperature (T) curve 550, or Rdc-T curve, is evaluated to generate 600 a battery resistance normalization factor (KRdc) versus temperature (T) curve based on the Rdc-T curve and an initial battery resistance (Rdc_Init) of the battery cell being tested, and provide an ideal battery resistance normalization factor to temperature (KRdc-T) curve. The curve fit of the ideal KRdc-T curve is determined 650 to provide an equation for the battery resistance (or battery internal DC impedance) normalization factor (KRdc) as a function of temperature (T).

The data of the battery resistance (Rdc) versus temperature (T) curve and the battery resistance (Rdc) versus state-of-charge (SOC) curve are combined and evaluated to generate 610 a battery resistance normalization factor versus (KRdc) versus state-of-charge (SOC) curve based on data for battery resistance (Rdc) versus state-of-charge (SOC), temperature (T) versus state-of-charge (SOC) and the initial battery resistance (Rdc_Init) and to provide an ideal battery resistance normalization factor (KRdc) versus state-of-charge (SOC) curve. The curve fit of the ideal KRdc-SOC curve is determined 660 to provide an equation for the normalization factor (KRdc) and state-of-charge (SOC) as a function of temperature (T).

The data of the battery resistance (Rdc) versus state-of-charge (SOC) curve and battery resistance (Rdc) versus impedance (Z) curve are combined and evaluated to generate 620 an ideal battery resistance (Rdc) versus impedance (Z) curve. The curve fit of the Rdc-Z curve is determined 670 to provide an equation for ideal impedance normalization factor (Kz) as a function of battery resistance (Rdc), temperature (T) and state-of-charge (SOC).

The data of the battery resistance (Rdc) versus state-of-health (SOH) curve is evaluated to generate 630 the ideal battery resistance (Rdc) versus state-of-health (SOH) curve based on self-normalization using a normalization factor (Krdc-soh) that is a function of the ratio of Rdc-SOH relative to Rdc-100, where Rdc-100 is the battery resistance (Rdc) versus 100% SOH. The curve fit of the Rdc-SOH curve is determined 680 to provide an equation for state-of-health (SOH) as a function of the normalization factor Krdc-soh.

All of the equations 640-680 are stored 690 in the computer readable medium or memory 120 for use in the algorithm 2000. The norm data determination routine 500, as described above and illustrated in FIG. 5, is repeated 695 for the number of battery cells to collect the norm data, and the ideal curves 590-630 and equations 640-680 updated with every new set of data collected for a particular battery cell, so that the larger the number of battery cells that are used to generate the norm data, the smaller the standard deviation between the data for each individual battery cell.

With reference to FIG. 4, once the norm data has been generated and stored 500 in the memory 120, the baseline normalization 700 of the battery 310 can be performed. The baseline normalization 700 can be performed prior to the battery 310 (e.g., battery pack) being placed into operation. For example, the baseline normalization 700 can be performed at manufacture of the battery 310. The baseline normalization 700 is stored in the memory 120 for use in normalizing measurements of the battery 310 after it is placed into service to the norm battery as defined by the norm data. Advantageously, the baseline normalization 700 factors out the battery-to-battery differences due to slight manufacturing deviations from the initial parameter conditions (e.g., initial impedance), so that the "normalized" data for the battery 310 will match the ideal or norm case at the predetermined temperature (e.g., 25° C.) and other controlled conditions.

FIG. 7 illustrates one embodiment of the baseline normalization 700 process or routine. When the baseline normalization 700 starts 710 prior to the battery 310 being placed into service (e.g., at the time of production or manufacture (ATP), the state-of-health (SOH) and state-of-charge (SOC) parameters are cleared from the memory 120. A complete charge/discharge/charge cycle is then performed 730 and the actual capacity of the battery 310 at a predetermined temperature (e.g., 25° C.) is determined 760. The capacity value is stored 780 in the memory 120 as the initial capacity (Init_Capacity) of the battery 310. The internal DC impedance of the battery 310 is measured (Rdc_meas), and the battery resistance normalization factor (KRdc) and battery resistance normalization factor versus state-of-charge (KRdc_SOH) is retrieved 750 from the memory 120, in order to determine 770 the internal DC impedance (Rdc) of the battery 310 at the predetermined temperature (e.g., 25° C.). Specifically, the internal DC impedance (Rdc) of the battery 310 at the predetermined temperature is calculated by the equation Rdc=(KRdc)*(KRdc_SOC)*(Rdc_meas). The calculated internal DC impedance (Rdc) value is stored 820 in the memory 120 as an initial internal DC impedance (Rdc_init). The initial capacity (Init_Capacity) and initial internal DC impedance (Rdc_init) are then used to determine 790 the battery-to-norm factor (KO, which is a function of the initial capacity (Init_Capacity) and initial internal DC impedance or battery resistance (Rdc_init) of the battery 310. The battery-to-norm factor (Kϕ) accounts for the small cell-to-cell and battery-to-battery Ah and impedance variances. The battery-to-norm factor (Kϕ) is then stored 800 in the memory 800. The internal DC impedance (Rdc) of the battery 310 at the predetermined temperature is also used to determine 830 the total impedance effect factor (Kzbatt) at the predetermined temperature, which is based on the impedance normalization factor (Kz) and a function of the internal DC impedance (Rdc) of the battery 310 (e.g., Kzbatt=(Kz)*(f(Rdc))). The total impedance effect factor (Kzbatt) is stored 840 in the memory 120. The initial capacity (Init_Capacity) value, battery-to-norm factor (Kϕ) and total impedance (Kzbatt) are used to calculate 810 the initial state-of charge (SOC) and state-of-health (SOH) of the battery 310. The initial capacity (Init_Capacity) in Amp-hours and initial impedance (Rdc) are stored in the computer readable medium or memory 120.

With reference to FIG. 4, while in shelf mode or state 410 (see FIG. 3), the state-of-charge of the battery 310 can be checked 900, which includes performing 910 a secondary normalization calculation of SOC, as discussed further below, and reporting 920 the SOC value. The secondary normalization calculation advantageously factors out the effects of variables in operational parameters on measurements taken (e.g., by the test module 200) under non-controlled conditions, such as higher or lower temperatures. The secondary normalization normalizes the measurements (e.g., impedance measurements) to factor out these effects so that the normalized measurements can be compared to the norm data to calculate the SOC and SOH of the battery 310 at the particular operating conditions when the test occurs.

As shown in FIG. 4, though the algorithm 2000 continuously performs SOC and SOH measurements, impedance measurements (Rdc_meas) are only performed when discharge of the battery 310 is not required (i.e., there is no power load requirement from the aircraft 350) and immediate charging of the battery 310 is not required, such as when the battery 310 has just been installed or is fully charged and no requiring discharge (e.g., during STANDBY TEST STATE 420). During other operating conditions of the battery 310, such as when in DISCHARGE STATE 430, CHARGE STATE 450, or transition from SLEEP STATE 460 to STANDBY STATE 440, the last value of impedance measurement (Rdc_meas) that is stored in the memory 120 is used to calculate the SOC and SOH of the battery 310.

When in STANDBY TEST STATE 420, as shown in FIG. 4, the test module 200 measures 930 the internal DC impedance (Rdc) of the battery 310. Then the algorithm 2000 performs 1000 the secondary normalization, as discussed below, and calculates the SOC and SOH of the battery 310. The algorithm 2000 then reports the SOC and SOH values to the external interface 300, which can be connected (e.g., removably connected) to one or more external monitoring or data capture devices (e.g., one or more computers, memory modules or computer readable medium). In contrast, when in DISCHARGE STATE 430, CHARGE STATE 450 or STANDBY STATE 440, the algorithm 2000 first retrieves 940 data (e.g., the last internal DC impedance measurement for the battery 310) from the memory 120, then performs 1000 the secondary normalization based on the retrieved data to calculate SOH and SOC, and reports 960 the SOC and SOH values.

FIG. 8 shows one embodiment of a secondary normalization 1000 process or routine. When the secondary normalization 1000 starts 1010, the internal DC impedance versus temperature (Rdc-T) relationship is retrieved 1020 from the memory 120. Internal DC impedance measurements (Rdc_meas) are performed 1030, if the battery 310 is in STANDY TEST STATE 420, or the last measured impedance value (Rdc_meas) is retrieved from the memory 120 if the battery 310 is not in STANDBY TEST STATE 420 (e.g., if the battery 310 is in CHARGE STATE 450). The impedance measurement (Rdc_meas) is performed by the test module 200 through a two-stage current pulse across the battery pack 310. The first pulse can be a low current pulse (e.g., about 1 second in duration) to condition the cells to a known operational state. The second pulse can be a high current pulse of short duration (e.g., about 100 msec). The test module 200 monitors the battery voltage (V), temperature (T) and current (I). From these measurements, the internal DC impedance (Rdc) can be calculated by the routine 1000.

Temperature compensation is then applied 1040 to the measured impedance value (Rdc_meas) using the battery resistance normalization factor KRdc (e.g., via the formula Rdc=(KRdc)*(Rdc_meas)) to calculate the normalized internal DC impedance value (Rdc). The routine 1000 then writes 1050 the temperature compensated impedance value (Rdc_comp) to the memory 120 or over-writes the previously stored value of impedance with the temperature compensated impedance value (Rdc). In other embodiments, the measured impedance value (Rdc_meas) can be normalized based on one or more other parameters, such as charge rate, discharge current, operational state, etc., in addition to temperature, to filter out variations based on these parameters and the compensated impedance value stored in the memory 120 as discussed above. The change in impedance from initial conditions is then calculated 1060 and normalized to the initial conditions for the battery 310 by multiplying the battery-to-norm factor (Kϕ) to the ratio of the compensated impedance value (Rdc_comp) over the initial impedance value (Init_Rdc) (e.g., via the formula Krdc_soh=Kϕ*(Rdc_comp/Init_Rdc)). The change in impedance (Krdc_soh) is then stored 1070 in the memory 120 or written over the previously stored value. The routine 1000 calculates 1080 the SOH of the battery 310 as a function of the calculated change in impedance (e.g., via the formula SOH=f(Krdc_soh)) and reports 1090 the SOH of the battery 310.

With continued reference to FIG. 8, the routine 1000 also performs 1100 voltage (Vmeas), current (Imeas) and temperature (Tmeas) measurements of the battery 310 via the measured system parameters, where the test module 200 drives the specific condition under which the measured system parameters are taken, and writes 1110 these measurements to the memory 120 and over-writes previous measurements of voltage (Vmeas), current (Imeas) and temperature (Tmeas) in the memory 120. The routine 1000 then determines 1120 the operational mode of the battery 310. If the battery 310 is in STANDBY MODE 420, the routine 1000 writes or over-writes 1130 the open circuit voltage (OCV) value with the measured voltage (Vmeas) value. The routine 1000 then calculates 1140 the state-of-charge (SOC) as a function of the OCV.

If the battery 310 is in CHARGE STATE 450, the routine 1000 calculates 1150 the equivalent open circuit voltage (OCV_equiv) based on the measured voltage value (Vmeas), the impedance normalization factor (Kz), the battery resistance (Rdc) and the charging current (Icharge) (e.g., via the equation OCV_equiv=Vmeas−(Kz*Rdc*Icharge)). The routine 1000 then writes or over-writes 1160 the open circuit voltage (OCV) value with the equivalent open circuit voltage (OCV_equiv) value. The routine 1000 then calculates 1140 the state-of-charge (SOC) as a function of the OCV.

If the battery 310 is in DISCHARGE STATE 430, the routine 1000 calculates 1170 the equivalent open circuit voltage (OCV_equiv) based on the measured voltage value (Vmeas), the impedance normalization factor (Kz), the battery resistance (Rdc) and the discharge current (Idischarge) (e.g., via the equation OCV_equiv=Vmeas+(Kz*Rdc*Idischarge)). The routine 1000 then writes or over-writes 1180 the open circuit voltage (OCV) value with the equivalent open circuit voltage (OCV_equiv) value. The routine 1000 then calculates 1140 the state-of-charge (SOC) as a function of the OCV.

With continued reference to FIG. 8, once the routine 1000 calculates 1140 the SOC based on the OCV value, it reports 1190 the SOC value to the external interface 300, which can be connected (e.g., removably connected) to one or more external monitoring or data capture devices (e.g., one or more computers, external memory modules or computer readable medium). The routine 1000 then repeats 1200 the secondary normalization process.

Advantageously, the algorithm 2000 is an adaptive algorithm that accounts for variances in battery cell parameters (e.g., that result from manufacturing variances) and of various operational parameters that might affect the determination of state-of-health (SOH) and state-of-charge (SOC) for the battery 310. The algorithm 2000 advantageously provides an empirical closed loop or feedback mechanism for monitoring the health of the battery 310, as opposed to a theoretical or feed-forward mechanism. The algorithm 2000 also advantageously accounts for all system internal impedances, including bus work, cables and interconnects so that any change in the system (e.g., a loose bus bar) that affects battery performance and/or health is accounted for in the impedance measurement and SOH and SOC calculations for the battery 310.

In one embodiment, the baseline normalization 700 and secondary normalization 1000 are performed on the battery pack 310, wherein the routines measure the internal DC impedance (Rdc or DCIR) of the battery pack 310, in the manner discussed above, and use these measurements to determine the SOC and SOH of the battery pack 310. As discussed above, the battery pack 310 can consist of a plurality of cells arranged in series or parallel configurations. Where the battery pack 310 comprises a plurality of cell modules 310a and all cell modules 310a age generally uniformly, such an embodiment advantageously provides an accurate measurement of SOH and SOC for the battery pack 310.

In another embodiment, the battery pack 310 can comprise a plurality of cell modules 310a, where cell modules 310a can age at different rates so that the health of the battery pack 310 is limited by the weakest cell module. In such an embodiment, the algorithm 2000, including the baseline normalization process or routine 700 and secondary or run-time normalization process or routine 1000 can be performed to measure the internal DC impedance (Rdc or DCIR) of individual cell modules 310a, which advantageously allows the algorithm 2000 to determine the age imbalance between the different cell modules 310a in the battery pack 310 and provides for improved accuracy of the SOC and SOH of the battery pack 310.

Additionally, with reference to FIG. 3, the charge of the cell modules 310a can be brought into balance during discharge by selectively turning on the charger/balancer modules (e.g., in the DISCHARGE BALANCE STATE 455) to transfer energy from the stronger cell modules 310a to the weakest cell modules 310a. As a result, the amount of energy that can be extracted from the battery pack 310 is improved.

Advantageously, the algorithm 2000 can measure the true health or capacity of each cell module 310a. For example, the algorithm 2000 can determine the charger/balancer modules that are operational (e.g., based on battery state information, system currents, voltages and/or operational state) and therefore can account for the improved energy extraction or SOH of the battery pack 310. Accordingly, in this embodiment, where internal DC impedance (Rdc) of individual cell modules 310a is measured, the algorithm 2000 can account for imbalances between the cell modules 310a of the battery pack 310, such as those imbalances caused by the discharge-balancing operation.

In operation, when the impedance test load current is initiated (e.g., by the current pulse generators 210, 220 of the test module 200), the voltage drop at the battery pack 310 indicates the impedance (Rdc) of the battery pack 310. However the same current pulse is a series current that passes through all battery cell modules 310a. Therefore the voltage drop through each cell module 310a provides the impedance (Rdc) measurement for each cell module 310a.

The processor 110 can execute the algorithm 2000, including the baseline normalization routine 700 and secondary normalization routine 1000, for each cell module 310a based on the measured internal DC impedance (Rdc) of each cell module 310a in the battery pack 310. The algorithm 2000 can thereby determine the weakest of the cell modules 310a (e.g., based on a comparison of the SOH for each of the cell modules 310a) and therefore more accurately calculate the SOH and SOC of the battery pack 310.

For a battery pack 310 that is balanced (or not in DISCHARGE BALANCE STATE 455), the algorithm 2000 can determine the SOH of the battery pack 310 based on the SOH of the weakest cell module 310a, as noted above, so that SOH_batt=SOH_min-module. However, during the DISCHARGE BALANCE STATE 455, one or more charger/balancers may be in operation at any give time, which can introduce efficiency losses so that it is not possible to extract all of the available energy from the battery pack 310. In such an occurrence, when providing for balancing using the charger/balancer modules, the battery capacity in Amp-hours can be provided by the sum of the capacities (Amp-hours or Ah) of the individual battery cell modules 310a divided by the number (x) of cell modules 310a, or AH_batt=(ΣAH_module1 . . . x)/x, where there are x cell modules 310a in the battery pack 310 and Amp-hours of the cell module 310a is calculated from the module SOH (%)*(Battery Nameplate Amp-hours). The algorithm 2000 can determine the number of charger/balancers in operation from the current measurements of the system, and therefore account for the efficiency losses discussed above to calculate the true battery capacity based on the formula AH_batt_true=AH_batt−(Keff*(#C/B)), where AH_batt_true is the calculated true battery capacity, AH_batt is the battery capacity calculated by adding the individual capacities of the cell modules 310a, Keff is the efficiency factor, which depends on the number of chargers/balancers (#C/B) in operation.

Accordingly, where the battery pack 310 has a plurality of cell modules 310a that age at different rates so that the health of the battery pack 310 is limited by the weakest cell module, the algorithm 2000 described above can be executed (e.g., by the processor 110) to calculate the SOH for each of the cell modules 310a of the battery pack 310, which requires that the baseline normalization 700 and secondary normalization 1000 be performed for each of the cell modules 1000. Additionally, the true battery capacity (AH_batt_true) is calculated as noted above for use with the algorithm 2000. Once the algorithm 200 has calculated the SOC and SOH for each of the battery modules 310a, the algorithm 2000 compares the calculated values to determine the SOC and SOH of the battery pack 310 based on the SOC and SOH of the weakest of the cell modules 310a.

Although these inventions have been disclosed in the context of a certain preferred embodiments and examples, it will be understood by those skilled in the art that the present inventions extend beyond the specifically disclosed embodiments to other alternative embodiments and/or uses of the inventions and obvious modifications and equivalents thereof. In addition, while a number of variations of the inventions have been shown and described in detail, other modifications, which are within the scope of the inventions, will be readily apparent to those of skill in the art based upon this disclosure. It is also contemplated that various combinations or subcombinations of the specific features and aspects of the embodiments may be made and still fall within one or more of the inventions. For example, steps of the method(s) disclosed herein can be performed in an order other than that disclosed in the illustrated embodiments, and additional, fewer, or different steps may be performed and still fall within the scope of the inventions. Accordingly, it should be understood that various features and aspects of the disclosed embodiments can be combine with or substituted for one another in order to form varying modes of the disclosed inventions. Thus, it is intended that the scope of the present inventions herein disclosed should not be limited by the particular disclosed embodiments described above

What is claimed is:

1. A system for characterizing the health of a rechargeable battery of an aircraft, comprising:
   a test module electrically connectable to a rechargeable battery having at least a first cell and a second cell, the test module configured to pass at least one current pulse across the battery, the test module configured to measure one or more operational parameters of the battery;
   a computer readable medium configured to store a standardized relationship data set for a norm battery that defines one or more relationships between a plurality of battery parameters, and one or more baseline normalization coefficients defining the relationship between the battery and the norm battery for normalizing parameters of the battery to the norm battery; and
   a computer processor configured to:
   receive the one or more measured operational parameters of said battery from the test module and retrieve the standardized relationship data set and baseline normalization coefficients from the computer readable medium, the processor configured to apply the standardized relationship data set and baseline normalization coefficients to the measured operational parameters to generate normalized operational parameter measurements, the processor further configured to calculate the state-of-health and state-of-charge of the battery based at least in part on the normalized operational parameter measurements;
conduct an impedance test on the battery,
determine whether power is needed by the aircraft while the impedance test is being performed, and
at least partly in response to a determination that power is needed by the aircraft while the impedance test is being performed, abort the impedance test and transition the battery to a discharge state;
determine whether the battery needs to be charged,
at least partly in response to a determination that that battery needs to be charged, transition the battery to a charge state, and
at least partly in response to a determination that power is needed by the aircraft while the battery is being charged, transition the battery to the discharge state;
while the battery is in the discharged state, determine if a delta voltage between the first cell and the second cell exceeds a first amount, and at least partly in response to a determination that the delta voltage between the first cell and the second cell exceeds the first amount, cause power sharing to be implemented for the first cell and the second cell so that the first cell and the second cell discharge at substantially the same time.

2. The system of claim 1, wherein the processor is further configured to communicate one or both of the calculated state-of-health and state-of-charge of the battery to a user interface.

3. The system of claim 1, wherein the at least one current pulse comprises a first current pulse of approximately 1 second in duration and a second current pulse of approximately 100 msec in duration.

4. The system of claim 1, wherein the one or more operational parameters of the battery include one or more of voltage, current, internal DC impedance, and temperature.

5. The system of claim 1, wherein the one or more relationships comprises one or more of an open cell voltage versus state-of-charge curve, a battery resistance versus temperature curve, a battery resistance versus state-of-charge curve, a battery resistance versus impedance curve, a battery resistance versus state-of-health curve, a charge versus time curve and a discharge versus time curve.

6. The system of claim 1, wherein the one or more baseline normalization coefficients are configured to account for battery-to-battery variances in impedance and/or amp-hours.

7. The system of claim 1, wherein the normalized operational parameter measurements account for battery-to-battery variances in one or more operational variables at the time of the operational parameter measurement.

8. The system of claim 7, wherein the one or more operational variables comprises battery temperature.

9. The system of claim 1, wherein the rechargeable battery is a battery pack that comprises one or more cell modules.

10. A method for characterizing the health of a rechargeable battery of an aircraft, comprising:
measuring one or more of parameters of a rechargeable battery prior to the battery being placed into service in an aircraft, the one or more measured parameters defining initial condition parameters of the battery, the battery comprising at least a first cell and a second cell;
performing a baseline normalization of the one or more initial condition parameters of the battery using a standardized relationship data set for a norm battery to generate one or more baseline normalization coefficients to normalize the one or more initial condition parameters of the battery to the norm battery;
measuring one or more parameters of a battery after the battery has been placed into service, said one or more parameters defining one or more run-time condition parameters of the battery;
performing a normalization of the one or more run-time condition parameters using the standardized relationship data set for the norm battery and the baseline normalization coefficients to generate one or more normalized run-time condition parameters for the battery;
comparing the one or more normalized run-time condition parameters to the standardized relationship data set for the norm battery, and calculating one or both of a state-of-charge and state-of-health for the battery at said run-time condition;
conducting an impedance test on the battery,
determining whether power is needed by the aircraft while the impedance test is being performed, and
at least partly in response to determining that power is needed by the aircraft while the impedance test is being performed, aborting the impedance test and transitioning the battery to a discharge state;
determining whether the battery needs to be charged,
at least partly in response to determining that that battery needs to be charged, transitioning the battery to a charge state, and
at least partly in response to determining that power is needed by the aircraft while the battery is being charged, transitioning the battery to the discharge state; and
while the battery is in the discharged state, determining if a delta voltage between the first cell and the second cell exceeds a first amount, and at least partly in response to determining that the delta voltage between the first cell and the second cell exceeds the first amount, causing power sharing to be implemented for the first cell and the second cell so that the first cell and the second cell discharge at substantially the same time.

11. The method of claim 10, further comprising outputting one or both of the calculated state-of-charge and state-of-health of the battery to a user interface.

12. The method of claim 10, wherein the one or more run-time condition parameters of the battery comprises an impedance of the battery.

13. The method of claim 12, wherein the impedance of the battery is measured by applying a first current pulse to the battery of approximately 1 second in duration and applying a second current pulse to the battery of approximately 10 msec in duration.

14. The method of claim 10, wherein the one or more run time condition parameters of the battery comprises one or more of voltage, current, internal DC impedance, and temperature.

15. The method of claim 10, wherein the standardized relationship data set comprises one or more of an open cell voltage versus state-of-charge curve, a battery resistance versus temperature curve, a battery resistance versus state-of-charge curve, a battery resistance versus impedance curve, a battery resistance versus state-of-health curve, a charge versus time curve and a discharge versus time curve.

16. The method of claim 10, wherein the one or more baseline normalization coefficients account for battery-to-battery variances in impedance and/or amp-hours.

17. The method of claim 10, wherein the normalization of the one or more run-time condition parameters account for battery-to-battery variances in one or more operational variables at the time of the run-time condition parameter is measured.

18. The method of claim 17, wherein the one or more operational variables comprises battery temperature.

19. The method of claim 10, wherein the rechargeable battery is a battery pack that comprises one or more cell modules.

20. A method for characterizing the health of a rechargeable battery of an aircraft, comprising:
- measuring, by a test module, one or more parameters of a battery after the battery has been placed into service, said one or more parameters defining one or more run-time condition parameters of the battery, the battery comprising at least a first cell and a second cell;
- retrieving, by a processor comprising hardware, a standardized relationship data set for a norm battery and one or more baseline normalization coefficients from a computer readable medium, said one or more baseline normalization coefficients generated from a baseline normalization of one or more initial condition parameters of the battery using the standardized relationship data set for the norm battery to eliminate battery-to-battery variances;
- performing, by the processor, a normalization of the one or more run-time condition parameters using the standardized relationship data set for the norm battery and the baseline normalization coefficients to generate one or more normalized run-time condition parameters for the battery; and
- comparing, by the processor, the one or more normalized run-time condition parameters to the standardized relationship data set for the norm battery, and calculating one or both of a state-of-charge and state-of-health for the battery at said run-time condition,
- conducting an impedance test on the battery,
- determining whether power is needed by the aircraft while the impedance test is being performed, and
- at least partly in response to determining that power is needed by the aircraft while the impedance test is being performed, aborting the impedance test and transitioning the battery to a discharge state;
- determining whether the battery needs to be charged,
- at least partly in response to determining that that battery needs to be charged, transitioning the battery to a charge state, and
- at least partly in response to determining that power is needed by the aircraft while the battery is being charged, transitioning the battery to the discharge state; and
- while the battery is in the discharged state, determining if a delta voltage between the first cell and the second cell exceeds a first amount, and at least partly in response to determining that the delta voltage between the first cell and the second cell exceeds the first amount, causing power sharing to be implemented for the first cell and the second cell so that the first cell and the second cell discharge at substantially the same time.

* * * * *

UNITED STATES PATENT AND TRADEMARK OFFICE
CERTIFICATE OF CORRECTION

PATENT NO.       : 9,157,968 B1
APPLICATION NO.  : 13/402659
DATED            : October 13, 2015
INVENTOR(S)      : Glen Taylor Page 1 of 1

It is certified that error appears in the above-identified patent and that said Letters Patent is hereby corrected as shown below:

In The Specification

In column 3 at line 11, delete "1 C" and insert --1C-- therefor.

In column 5 at line 66, after "CHARGE" delete ".".

In column 8 at line 17, delete "(KO," and insert --(KΦ),-- therefor.

In column 11 at line 51, delete "give" and insert --given-- therefor.

In The Claims

In column 13 at line 14, In Claim 1, delete "that that" and insert --that the-- therefor.

In column 14 at line 26, In Claim 10, delete "that that" and insert --that the-- therefor.

In column 16 at line 15, In Claim 20, delete "that that" and insert --that the-- therefor.

Signed and Sealed this
Ninth Day of August, 2016

Michelle K. Lee
*Director of the United States Patent and Trademark Office*